United States Patent
Kamatani et al.

(10) Patent No.: US 9,842,997 B2
(45) Date of Patent: Dec. 12, 2017

(54) ORGANIC LIGHT EMITTING ELEMENT AND DISPLAY DEVICE

(71) Applicant: CANON KABUSHIKI KAISHA, Tokyo (JP)

(72) Inventors: Jun Kamatani, Tokyo (JP); Tetsuya Kosuge, Yokohama (JP); Masumi Itabashi, Kodaira (JP); Yosuke Nishide, Kawasaki (JP); Hirokazu Miyashita, Tokyo (JP); Naoki Yamada, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 478 days.

(21) Appl. No.: 14/560,534

(22) Filed: Dec. 4, 2014

(65) Prior Publication Data
US 2015/0162545 A1 Jun. 11, 2015

(30) Foreign Application Priority Data
Dec. 6, 2013 (JP) ................. 2013-253636

(51) Int. Cl.
*H01L 51/00* (2006.01)
*H01L 27/32* (2006.01)
*H01L 51/50* (2006.01)

(52) U.S. Cl.
CPC ........ *H01L 51/0067* (2013.01); *H01L 51/005* (2013.01); *H01L 51/0058* (2013.01);
(Continued)

(58) Field of Classification Search
CPC ........... H01L 2251/5361; H01L 51/005; H01L 51/0058; H01L 51/0067; H01L 51/0074; H01L 51/5072; H01L 51/5092
See application file for complete search history.

(56) References Cited

FOREIGN PATENT DOCUMENTS

JP 63-280254 A 11/1988
JP 2002-100482 A 4/2002
(Continued)

OTHER PUBLICATIONS

Derwent abstract for NL 8500278 A (publication date Sep. 1, 1986).*
(Continued)

*Primary Examiner* — Dawn Garrett
(74) *Attorney, Agent, or Firm* — Canon U.S.A.Inc.

(57) ABSTRACT

An organic light emitting element contains an anode and a cathode, and a light emitting layer arranged between the anode and the cathode. The organic light emitting element further contains an organic compound layer which is arranged between the cathode and the light emitting layer and touches the cathode. The organic compound layer contains a bisimidazolidene compound represented by the following general formula [1], where $R_1$ to $R_{12}$ represent substituents.

[1]

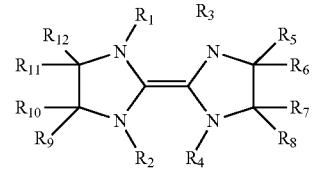

16 Claims, 4 Drawing Sheets

(52) U.S. Cl.
CPC ...... *H01L 51/0074* (2013.01); *H01L 51/5072* (2013.01); *H01L 51/5092* (2013.01); *H01L 2251/5361* (2013.01)

(56) References Cited

FOREIGN PATENT DOCUMENTS

| | | |
|---|---|---|
| JP | 2003-068468 A1 | 3/2003 |
| NL | 8500278 A * | 9/1986 |

OTHER PUBLICATIONS

Tilman Donath, PhD., et al.; A Journal of Clinical and Laboratory Research Investigative Radiology; Toward Clinical X-ray Phase-Contrast CT; vol. 45, No. 7—Jul. 2010.
David M. Lemal, et al.; Journal of the American Chemical Society; Tetraaminoethylenes. The Question of Dissociation; vol. 86, No. 12; Jun. 20, 1964.

* cited by examiner

ORGANIC LIGHT EMITTING ELEMENT AND DISPLAY DEVICE

BACKGROUND OF THE INVENTION

Field of the Invention

The present invention relates to a bisimidazolidene compound, an organic light emitting element containing the same and a display device.

Description of the Related Art

An organic light emitting element is an element containing an anode and a cathode, and an organic compound layer arranged between both electrodes. In the organic light emitting element, excitons are generated by recombination of holes and electrons injected from the above each electrode in a light emitting layer, which is an organic compound layer, and light is released when the excitons return to the ground state. With the recent significant advances in organic light emitting elements, it is possible to make a slim lightweight light emitting device which has low driving voltage, diverse light emission wavelengths and high responsivity.

In an organic light emitting element, improvements in electron injection properties are preferred to lower voltage to drive the element. As a technique to improve electron injection properties, a technique in which metals are used in electron injection layers of an organic light emitting element is described in Japanese Patent Application Laid-Open No. 2003-68468 and Japanese Patent Application Laid-Open No. 2002-100482.

In addition, the synthesis method of a compound like 1-A is described in Journal of American Chemical Society, 1964, 86(12), pp 2518-2519. The use of this compound for a photo conductor is described in Japanese Patent Application Laid-Open No. S63-280254; however, there is no description about using the compound for an organic light emitting element.

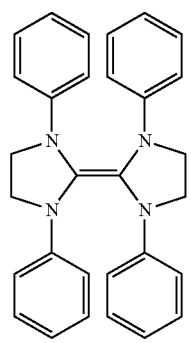

1-A

In Japanese Patent Application Laid-Open No. 2003-68468 and Japanese Patent Application Laid-Open No. 2002-100482, an organic light emitting element in which metals are contained in electron injection layers is described. This organic light emitting element contains metals in the electron injection layers. Thus, a stable organic light emitting element cannot be obtained. This is because these metals have high reactivity to moisture.

Because these metals react with moisture, stability as an organic light emitting element decreases.

SUMMARY OF THE INVENTION

An object of the present invention is to provide an organic light emitting element with high stability by containing a bisimidazolidene compound with low reactivity to moisture in an electron injection layer.

Therefore, aspects of the present invention provide an organic light emitting element containing an anode and a cathode, and a light emitting layer arranged between the anode and the cathode. The organic light emitting element further contains an organic compound layer which is arranged between the cathode and the light emitting layer and touches the cathode. The organic compound layer contains a bisimidazolidene compound represented by the following general formula [1].

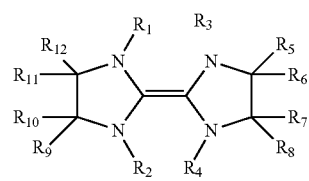

[1]

In the formula [1], $R_1$ to $R_4$ are substituents each independently selected from a substituted or unsubstituted phenyl group, a substituted or unsubstituted benzyl group, a substituted or unsubstituted biphenyl group, a substituted or unsubstituted naphthyl group, a substituted or unsubstituted phenanthrenyl group, a substituted or unsubstituted fluorenyl group, a substituted or unsubstituted triphenylenyl group, a substituted or unsubstituted dibenzofuranyl group and a substituted or unsubstituted dibenzothiophenyl group.

$R_5$ to $R_{12}$ are substituents each independently selected from a hydrogen atom, an alkyl group having 1 or more and 4 or less carbon atoms and a substituted or unsubstituted phenyl group.

Further features of the present invention will become apparent from the following description of exemplary embodiments (with reference to the attached drawings).

DESCRIPTION OF THE EMBODIMENTS

Figure 1:
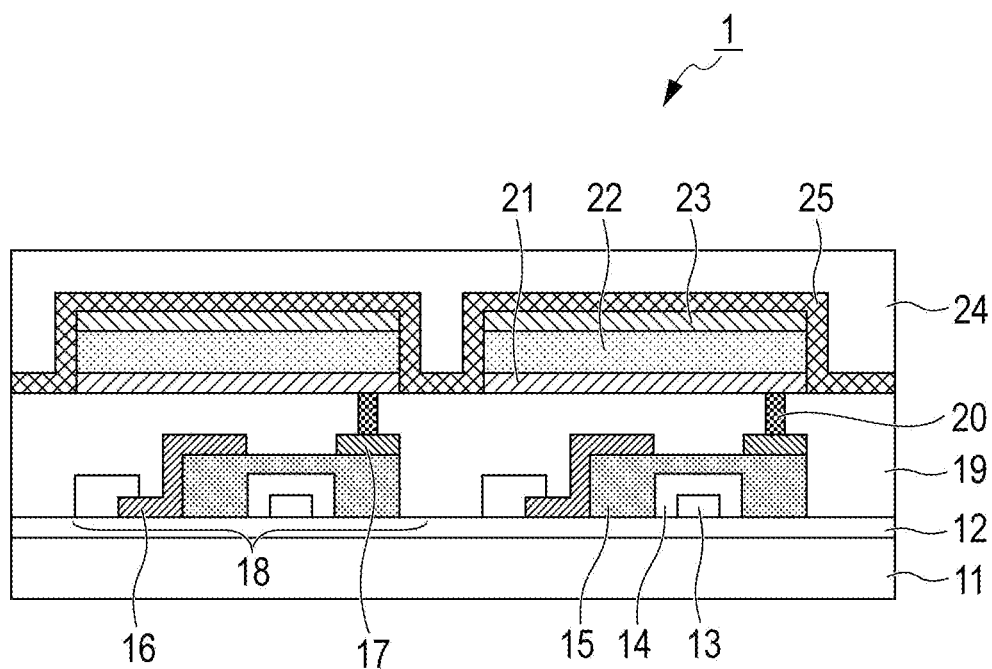
FIG. 1 is a cross-sectional schematic diagram showing an organic light emitting element according to the present invention and an active element connected to the organic light emitting element.

The light emitting element according to the present invention is an organic light emitting element containing an anode and a cathode, and a light emitting layer which is arranged between the anode and the cathode, and the organic light emitting element further containing an organic compound layer which is arranged between the cathode and the light emitting layer and touches the cathode, wherein this organic compound layer contains a bisimidazolidene compound represented by the following general formula [1].

The organic compound layer containing a bisimidazolidene compound can be also referred to as an electron injection layer.

It is noted that in the present embodiment, substituted or unsubstituted means that a substituent may be contained or may not be contained. In addition, containing a substituent means that a terminal hydrogen atom of the structure of the organic compound is replaced with a substituent.

(Explanation of the Bisimidazolidene Compound According to the Present Invention)

The bisimidazolidene compound according to the present invention is represented by the following general formula [1].

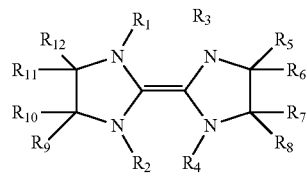

[1]

In the formula [1], $R_1$ to $R_4$ are substituents each independently selected from a substituted or unsubstituted phenyl group, a substituted or unsubstituted benzyl group, a substituted or unsubstituted biphenyl group, a substituted or unsubstituted naphthyl group, a substituted or unsubstituted phenanthrenyl group, a substituted or unsubstituted fluorenyl group, a substituted or unsubstituted triphenylenyl group, a substituted or unsubstituted dibenzofuranyl group and a substituted or unsubstituted dibenzothiophenyl group.

Specific examples of alkyl groups having 1 or more and 4 or less carbon atoms are a methyl group, an ethyl group, an n-propyl group, an iso-propyl group, an n-butyl group, an iso-butyl group, a sec-butyl group and a tert-butyl group.

The above-mentioned phenyl group, benzyl group, biphenyl group, naphthyl group, phenanthrenyl group, fluorenyl group, triphenylenyl group, dibenzofuranyl group and dibenzothiophenyl group may contain substituents. The substituents are alkyl groups such as a methyl group, an ethyl group, an n-propyl group, an iso-propyl group, an n-butyl group, an iso-butyl group, a sec-butyl group and a tert-butyl group; hydrocarbon aromatic ring groups such as a phenyl group, a naphthyl group, a phenanthrenyl group and a fluorenyl group; heteroaromatic ring groups such as a thienyl group, a dibenzofuran group, a dibenzothiophene group, a pyrrolyl group and a pyridyl group; alkoxy groups such as a methoxy group, an ethoxy group, a propoxy group and a butoxy group; aryloxy groups such as a phenoxy group and a naphthoxy group; an amino group having an alkyl group or a phenyl group, a cyano group, and halogen atoms such as fluorine, chlorine, bromine and iodine.

$R_5$ to $R_{12}$ are each independently selected from a hydrogen atom, an alkyl group having 1 or more and 4 or less carbon atoms, and a substituted or unsubstituted phenyl group.

This phenyl group may contain an alkyl group having 1 or more and 4 or less carbon atoms as a substituent.

(On Properties of the Bisimidazolidene Compound According to the Present Invention)

The bisimidazolidene compound according to the present invention absorbs short wavelengths, 450 nm or less, and hardly absorbs the light emission wavelength of an organic light emitting element. Therefore, when the organic compound is used as an electron injection layer, the inhibition of light emission of light emitting materials can be reduced, which is caused by absorption of a compound in the electron injection layer.

This is because, among bisimidazolidene compounds, the compound according to the present invention has SP3 carbons at positions 4, 4', 5 and 5' as shown in the following structural formula [2].

On the other hand, a compound which has SP2 carbons at positions 4, 4', 5 and 5' and is represented by the structural formula [3] has an absorption band in the visible region, 600 nm or more. This becomes a factor to cause efficiency reduction of an organic light emitting element, which is not preferred. From this point, the bisimidazolidene compound of the present invention is suitable for an organic light emitting element.

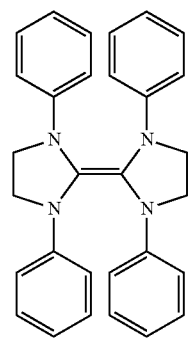

[2]

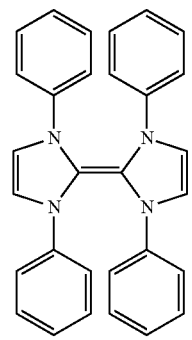

[3]

In addition, it is preferred that the substituents which are substituted on nitrogen atoms be substituents which sterically protect the surroundings of nitrogen, for example, an aromatic ring group and a benzyl group. This is important to protect atoms in the surroundings of nitrogen, which have high charge density, from water and the like. The compound having a substituent like an alkyl group becomes unstable to water, which decreases the stability of electron injection materials.

In order to examine the stability to water, powders of lithium fluoride and cesium fluoride used as electron injection materials using metals, and bisimidazolidene derivative compounds were left under high humidity, 95%, for an hour.

The results after comparison are shown in Table 1.

TABLE 1

| COMPOUND USED IN PRESENT INVENTION | 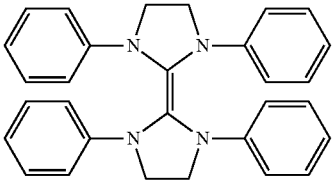 [SMILES: c1ccc(N2CCN(c3ccccc3)C2=C2N(c3ccccc3)CCN2c2ccccc2)cc1] | DELIQUESCENCE NO CHANGES |
|---|---|---|
| COMPARATIVE COMPOUND 1 | LiF | SLIGHTLY DELIQUESCED |
| COMPARATIVE COMPOUND 2 | CsF | DELIQUESCED |
| COMPARATIVE COMPOUND 3 | 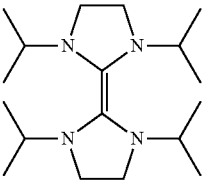 [SMILES: CC(C)N1CCN(C(C)C)C1=C1N(C(C)C)CCN1C(C)C] | DELIQUESCED |
| COMPARATIVE COMPOUND 4 | 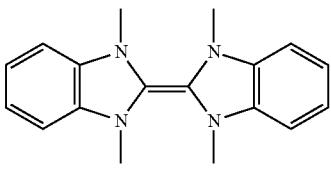 [SMILES: CN1C(=C2N(C)c3ccccc3N2C)N(C)c2ccccc21] | DELIQUESCED |

Consequently, the alkali metal salts and the bis-imidazolidene compounds in which substituents on nitrogen atoms have alkyl groups deliquesced, while the compound of the present invention did not change. By using such material, a stable organic light emitting element can be obtained.

In addition, when oxidation potential is measured, the compound represented by the structural formula [2] has a low oxidation potential value, −0.72 V. Due to having such a low oxidation potential, it can be said that the compound is a material with high donor properties. By mixing this material with a material with high acceptor properties, a charge-transfer complex can be formed. By using this charge-transfer complex for an electrode interface layer of an organic light emitting element, a metal from an electrode can be easily injected.

The organic light emitting element according to the present embodiment may contain a second compound which is of a different type from a bisimidazolidene compound in an electron injection layer.

The second compound is preferably a compound with higher oxidation potential than that of a bisimidazolidene compound.

Herein, high oxidation potential indicates that the absolute value of oxidation potential is high.

When the sum total of a bisimidazolidene compound and a second compound is 100 wt %, the weight ratio of the second compound is preferably 0.1 wt % to 80 wt %, and more preferably 50 wt %.

By using a bisimidazolidene compound with low oxidation potential for an electron injection layer of an organic light emitting element, an organic light emitting element which has high stability to water as compared to when using alkali metal salts and alkali metals which have been used until now can be provided.

On Properties of the Organic Light Emitting Element Using the Bisimidazolidene Compound According to the Present Invention The compound according to the present invention is mainly used for at least one layer of an electron injection layer, an electron transport layer, a hole transport layer, and a hole injection layer in an organic light emitting element.

A hole blocking layer is used as a meaning of a layer to block holes, but in the present invention, a layer adjoining to the cathode side of a light emitting layer is referred to as a hole blocking layer. That is, the hole blocking layer is arranged between a light emitting layer and a cathode.

At this time, the light emitting layer may be constituted of a plurality of components, and the components can be divided into the main component and the minor component. The main component is a compound with a maximum weight ratio among all compounds constituting a light emitting layer, and can be referred to as a host material.

The minor components are compounds other than the main component. The minor components can be referred to as a guest (dopant) material, an emitting assist material and a charge injection material. The emitting assist material and the charge injection material may be organic compounds which have the same structure or organic compounds which have different structures. These are minor components, but can be also referred to as host materials 2 in the sense of distinguishing from a guest material.

Herein, the guest material is a compound responsible for main light emission in a light emitting layer. Contrarily, the host material is a compound existing as a matrix around the guest material in a light emitting layer, and is a compound mainly responsible for carrier transport and donation of excitation energy to the guest material.

The concentration of guest material is 0.01 wt % or more and 50 wt % or less, and preferably 0.1 wt % or more and 20 wt % or less based on the whole amount of constituent materials for a light emitting layer. More preferably, it is desired that the concentration of guest material be 10 wt % or less to prevent concentration quenching.

In the layer including a host material, a guest material may be entirely uniformly contained, or may be contained with a concentration gradient, or the guest material may be contained in a specific region to provide a host material layer region without the guest material.

(Exemplification of the Bisimidazolidene Compound According to the Present Invention)

Specific structural formulae of the bisimidazolidene compound according to the present invention will now be exemplified.

A1

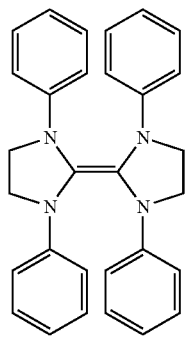

A2

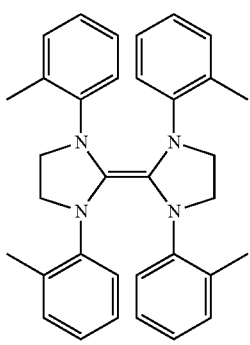

A3

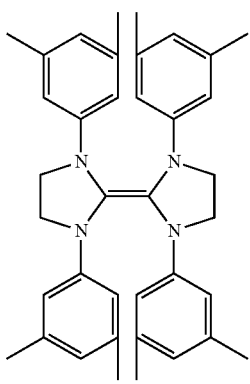

-continued

A4

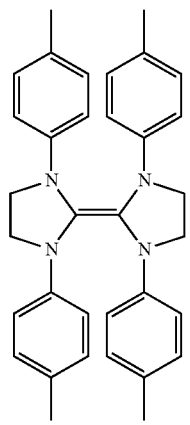

A5

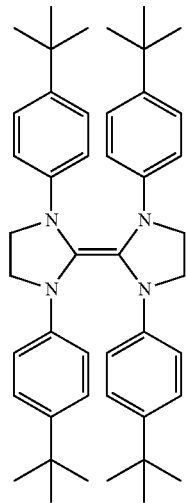

A6

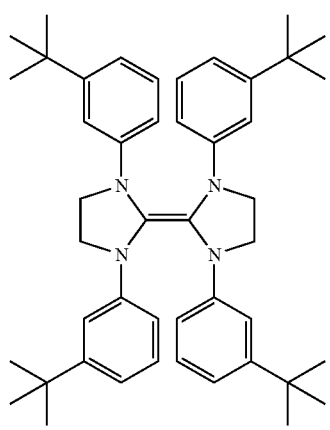

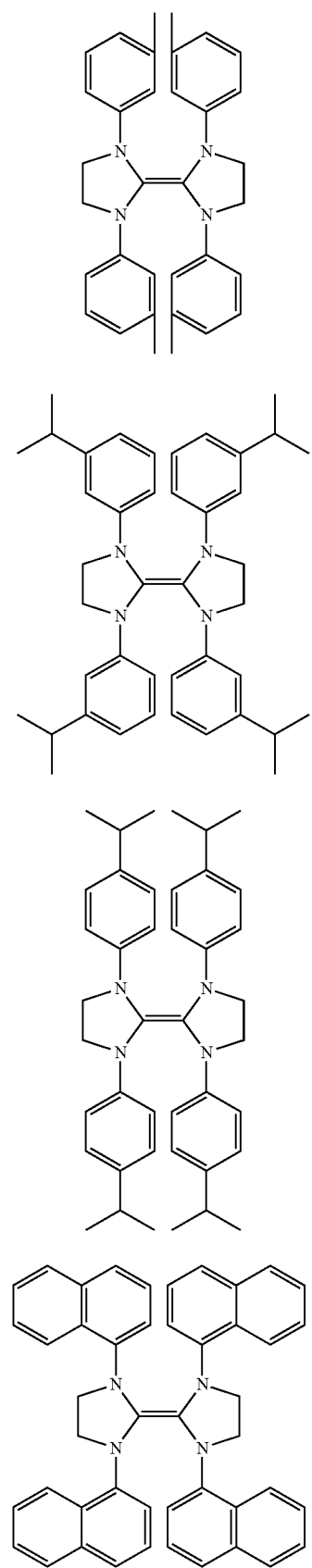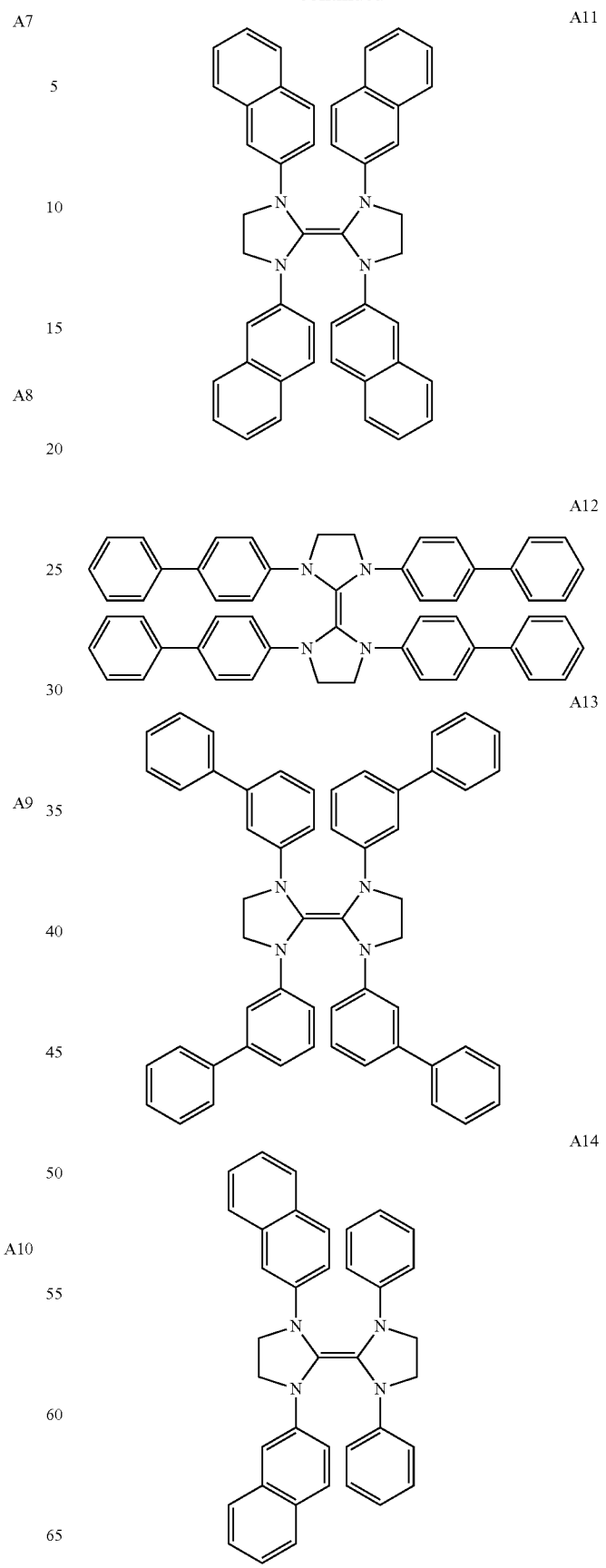

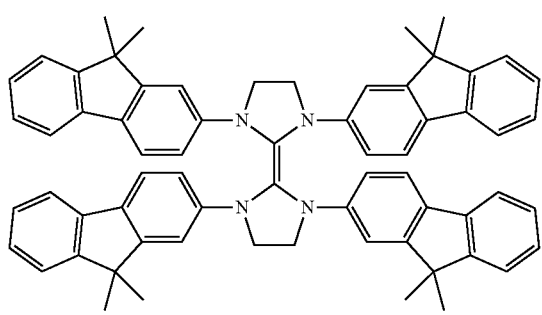
A15
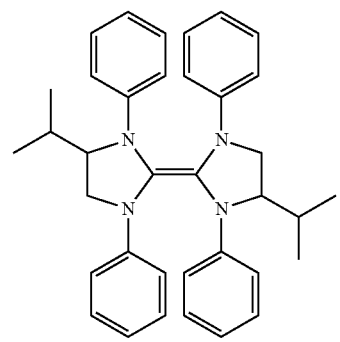
A16
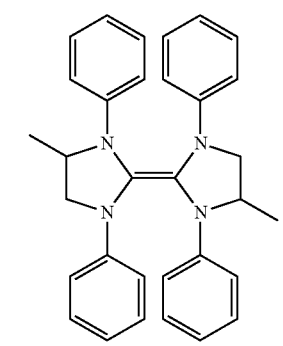
A17
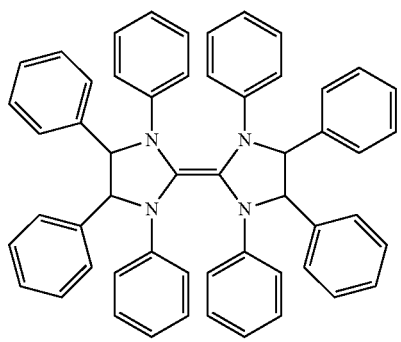
A18
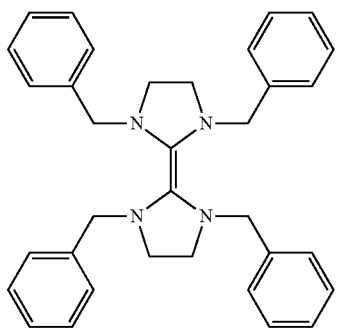
A19
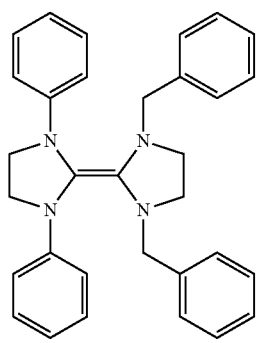
A20
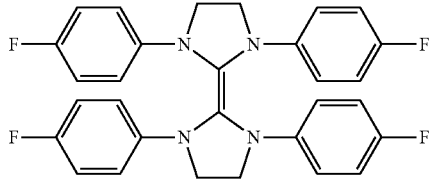
B1
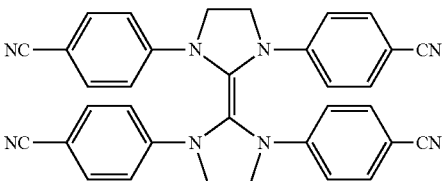
B2
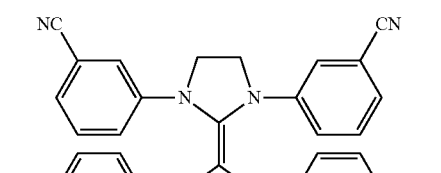
B3
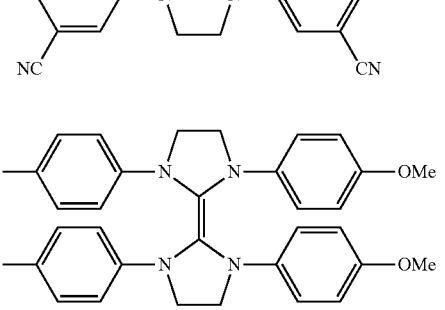
B4

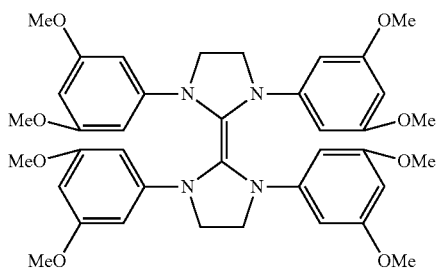
B5

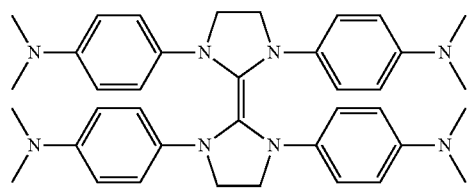
B6

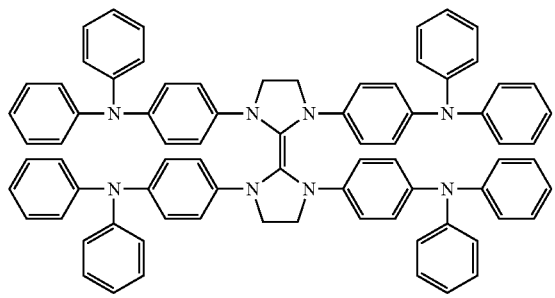
B7

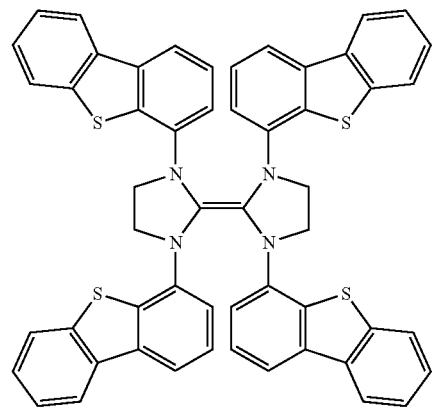
B8

Among exemplified compounds, the compounds shown in the A group contain a hydrocarbon aromatic substituent or an alkyl group as a substituent. This controls crystallinity and sublimability while maintaining a state in which the oxidation potential of the bisimidazolidene skeleton is low. Thus, a stable material can be produced.

Among exemplified compounds, the compounds shown in the B group contain an aromatic substituent containing a heterocycle or a substituent having a hetero group as a substituent. These are preferred compounds to provide a substituent when changing the oxidation potential in accordance with surrounding materials, for example the oxidation potential is further lowered or raised based on the bisimidazolidene skeleton. Thus, a material having an energy level suitable for an element can be produced.

Synthesis Method of the Bisimidazolidene Compound According to the Present Invention The bisimidazolidene compound used for the light emitting element of the present invention was synthesized with reference to Organic Syntheses, Coll. Vol. 5, p. 115 (1973); Vol. 47, p. 14 (1967). Diamines, which are raw materials, were synthesized with reference to Philipp Wucher, Philipp Roesle, Laura Falivene, Luigi Cavallo, Lucia Caporaso, Inigo Gottker-Schnetmann, Stefan Mecking, Organometallics, 2012, 31(24), pp 8505-8515. Bisimidazolidenes having a variety of substituents were synthesized using these compounds.

Organic Light Emitting Element According to the Present Invention

The organic light emitting element according to the present invention is a light emitting element containing at least an anode and a cathode, which are a pair of electrodes facing each other, and an organic compound layer arranged between them. The organic light emitting element according to the present invention contains a bisimidazolidene compound characterized by being represented by the following general formula [1] in an electron injection layer which touches the electrode of the organic light emitting layer.

As the element constitution of the organic light emitting element according to the present invention, multilayered element constitution in which organic compound layers given below are sequentially laminated on a substrate is mentioned. It is noted that among the above organic compound layers, a layer containing a light emitting material is a light emitting layer.

(1) anode/light emitting layer/cathode
(2) anode/hole transport layer/light emitting layer/electron transport layer/cathode
(3) anode/hole transport layer/light emitting layer/electron transport layer/electron injection layer/cathode
(4) anode/hole injection layer/hole transport layer/light emitting layer/electron transport layer/cathode
(5) anode/hole injection layer/hole transport layer/light emitting layer/electron transport layer/electron injection layer/cathode
(6) anode/hole transport layer/electron blocking layer/light emitting layer/hole blocking layer/electron transport layer/cathode Certainly, the constitution of the organic light emitting elements of the present invention is not limited thereto.

Diverse layer constitution can be created, for example, an insulating layer is provided in the interface between an electrode and an organic compound layer, an adhesive layer or an interference layer is provided, an electron transport layer or a hole transport layer is constituted of two layers with different ionization potentials, a light emitting layer is constituted of two layers with different light emitting materials, and the like.

The element form in this case can be a form in which light is produced from an electrode on the substrate side, i.e. a bottom emission system, and a form in which light is produced from the opposite side of a substrate, i.e. a top emission system, and constitution in which light is produced from the both sides can be also used.

In addition, among the above-mentioned element constitution, the constitution (6) containing both an electron blocking layer and a hole blocking layer is preferably used. In the constitution (6), both carriers, holes and electrons, can be blocked in a light emitting layer, and thus a light emitting element with high light emission efficiency without carrier leakage can be obtained.

In the organic light emitting element according to the present invention, an organic compound layer containing a bisimidazolidene compound represented by the formula [1] is preferably an electron injection layer, but can be also used for an electron transport layer.

On the Organic Light Emitting Element According to the Present Invention

Next, the organic light emitting element of the present embodiment will be described.

The organic light emitting element of the present invention contains at least an anode and a cathode which are a pair of electrodes, and an organic compound layer arranged between these electrodes. In the organic light emitting element of the present embodiment, the organic compound layer may be a monolayer or a laminate including a plurality of layers as long as a light emitting layer is contained.

Herein, when organic compound layers are a laminate including a plurality of layers, the organic compound layers can contain a hole injection layer, a hole transport layer, an electron blocking layer, a hole/exciton blocking layer, an electron transport layer, an electron injection layer and the like in addition to the light emitting layer. In addition, the light emitting layer may be a monolayer or a laminate including a plurality of layers.

The organic light emitting element of the present embodiment contains an organic compound represented by the general formula [1] in an electron injection layer.

An organic compound represented by the general formula [1] may be used for a layer other than the electron injection layer, and is specifically contained in any of the above-described light emitting layer, hole injection layer, hole transport layer, electron blocking layer, hole/exciton blocking layer, electron transport layer, electron injection layer and the like. The organic compound according to the present embodiment is preferably contained in the electron injection layer.

In the organic light emitting element of the present embodiment, when the organic compound according to the present invention is contained in an electron injection layer, the electron injection layer may be a layer including only the organic compound according to the present embodiment, or a layer including the organic compound according to the present embodiment and other compounds.

The light emitting layer of the organic light emitting element according to the present embodiment may be a light emitting layer containing a host and a guest, and may have the constitution in which an assist material is further contained.

Herein, the host is a compound with a maximum weight ratio among compounds constituting a light emitting layer. In addition, the guest is a compound with lower weight ratio than that of the host among compounds constituting a light emitting layer, and is a compound responsible for main light emission. In addition, the assist material is a compound which has lower weight ratio than that of the host among compounds constituting a light emitting layer and assists the light emission of the guest. It is noted that the assist material is also referred to as a second host.

This light emitting layer may be a monolayer or the multilayer form. By containing light emitting materials with two or more emission colors, colors can be mixed. The multilayer form means a state in which a light emitting layer and another light emitting layer are laminated. In this case, the emission color of an organic light emitting element is from blue to green and red, but not particularly limited thereto.

More specifically, the emission color may be a white color or a neutral color. In the case of the white color, a form in which a plurality of light emitting layers emitting red, blue and green is mixed, or a form in which complementary colors such as cyan and yellow are mixed to obtain a white color may be used. In addition, a film is formed by a film forming method such as deposition or coating film formation.

In the organic light emitting element according to the present embodiment, an organic compound layer contains a light emitting unit, and this light emitting unit can contain a plurality of light emitting materials. Any two of the plurality of light emitting materials are light emitting materials emitting light different from each other, and an element containing these materials may be an element emitting a white color.

The organic compound according to the present embodiment can be used as a constituent material of organic compound layers constituting the organic light emitting element of the present embodiment other than a light emitting layer, and specifically may be used as a constituent material of an electron transport layer, an electron injection layer, a hole transport layer, a hole injection layer, a hole blocking layer and the like.

Herein, in addition to the organic compound according to the present embodiment, conventionally known low molecular and high molecular light emitting materials, hole injection compounds or hole transport compounds, host compounds, light emitting compounds, electron injection compounds or electron transport compounds and the like can be used together as needed.

Examples of these compounds will be now mentioned.

As the hole injection/transport materials, a material with high hole mobility is preferred so that holes can be easily injected from an anode and injected holes can be transported to a light emitting layer. In addition, in order to prevent film deterioration such as crystallization in an organic light emitting element, a material with high glass transition temperature is preferred.

As the low molecular and high molecular materials with hole injection/transport properties, triarylamine derivatives, arylcarbazole derivatives, phenylenediamine derivatives, stilbene derivatives, phthalocyanine derivatives, porphyrin derivatives, poly(vinylcarbazole), poly(thiophene), other conductive polymers are mentioned. Further, the above-mentioned hole injection/transport materials are also suitably used for an electron blocking layer.

Specific examples of compounds used as hole injection/transport materials will be now mentioned, but certainly not limited thereto.

HT1
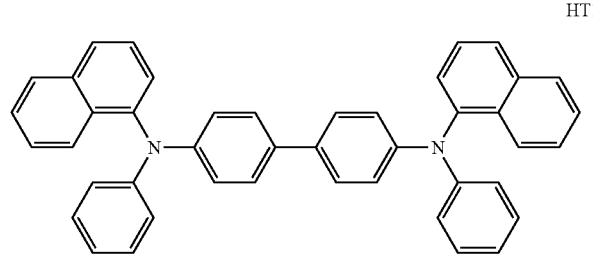
HT2
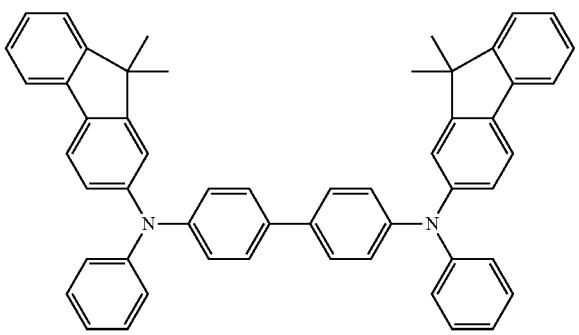
HT3
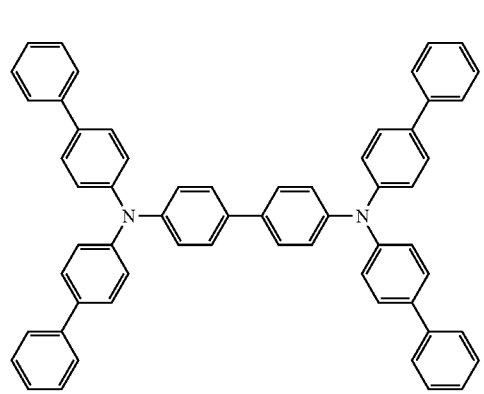
HT4
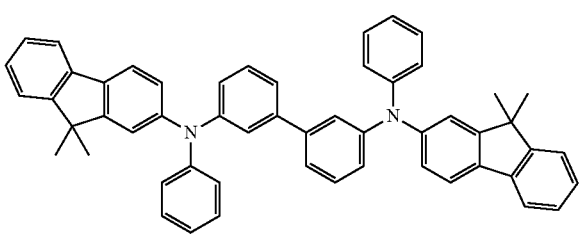
HT5
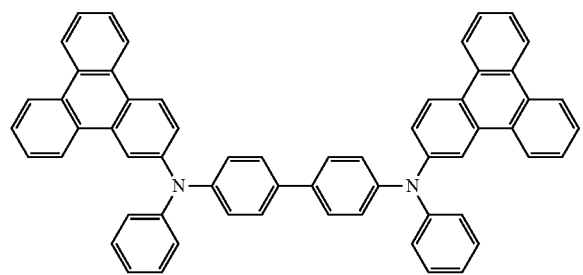
HT6
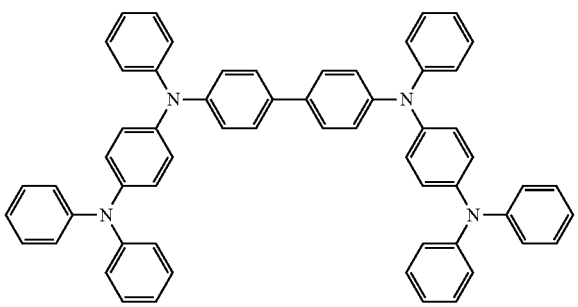
HT7
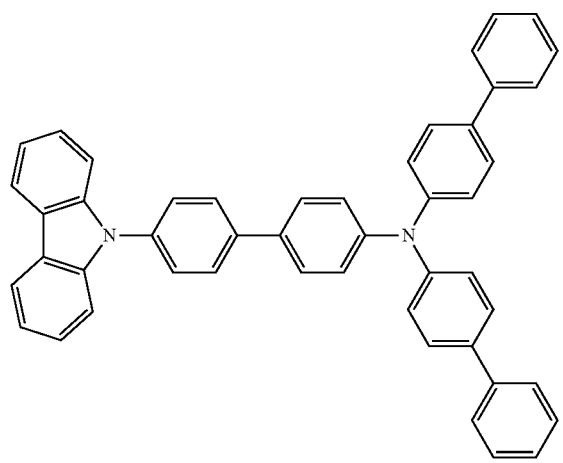
HT8
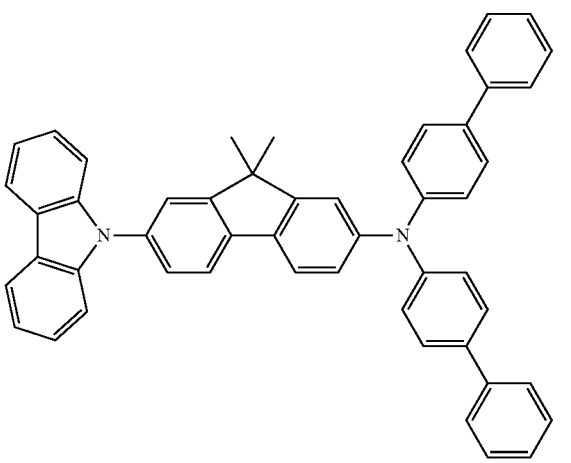

-continued
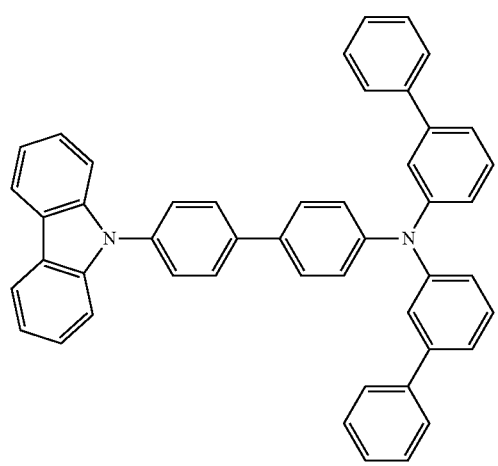
HT9
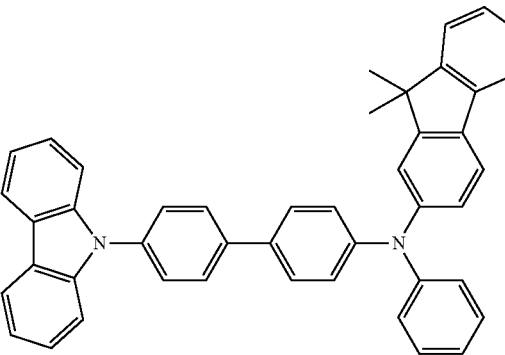
HT10
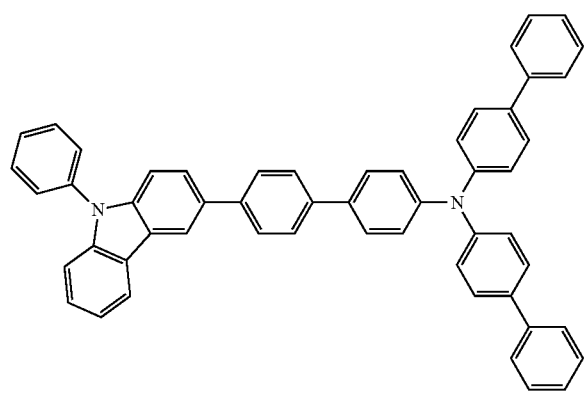
HT11
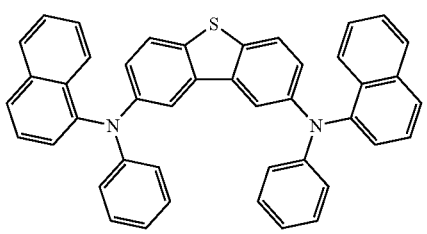
HT12
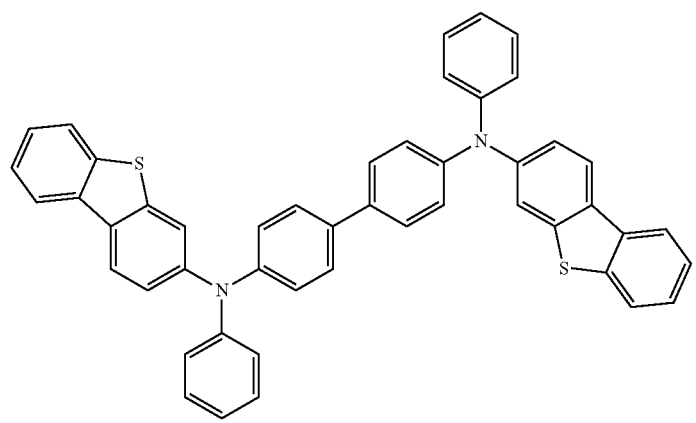
HT13

HT14

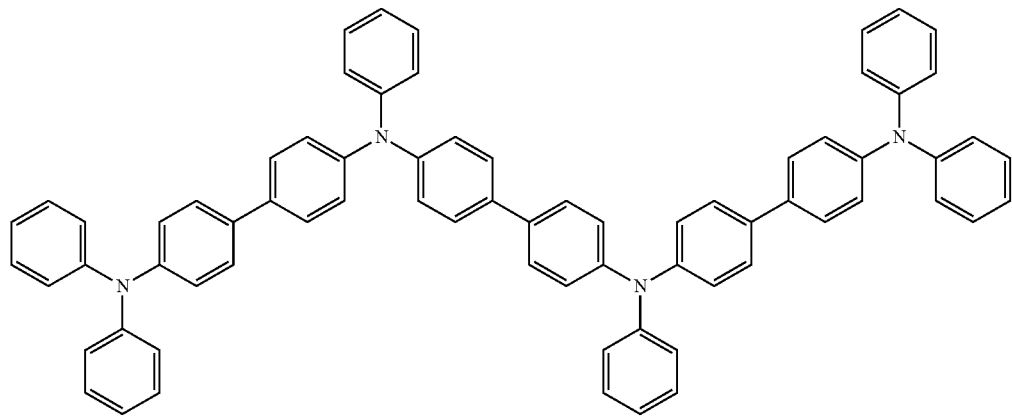

As the light emitting materials mainly according to light emitting function, fused ring compounds (e.g. fluorene derivatives, naphthalene derivatives, pyrene derivatives, perylene derivatives, tetracene derivatives, anthracene derivatives, rubrene etc.), quinacridone derivatives, coumarin derivatives, stilbene derivatives, organic aluminum complexes such as tris(8-quinolinolate)aluminum, iridium complexes, platinum complexes, rhenium complexes, copper complexes, europium complexes, ruthenium complexes, and polymer derivatives such as poly(phenylenevinylene) derivatives, poly(fluorene) derivatives and poly(phenylene) derivatives are mentioned.

Specific examples of compounds used as light emitting materials will be now mentioned, but certainly not limited thereto.

BD1

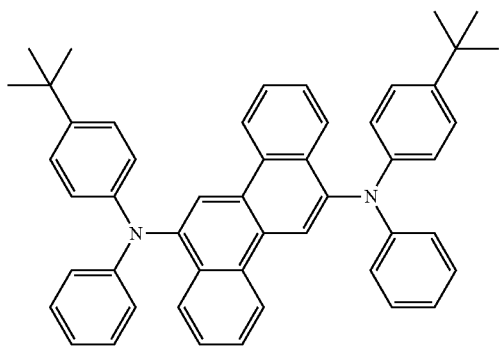

BD2

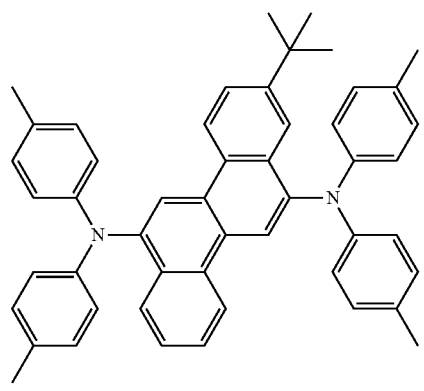

BD3

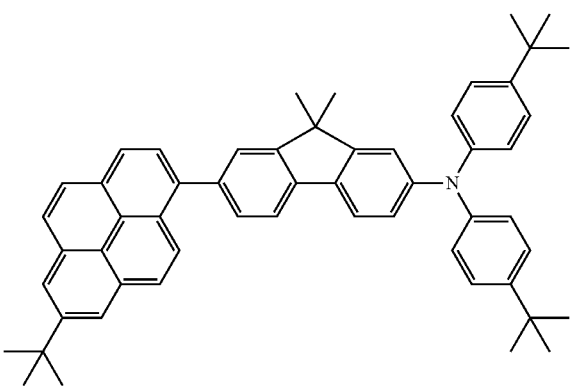

BD4

BD5

BD6
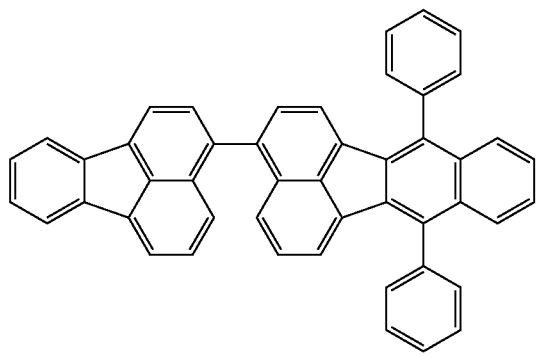
BD7
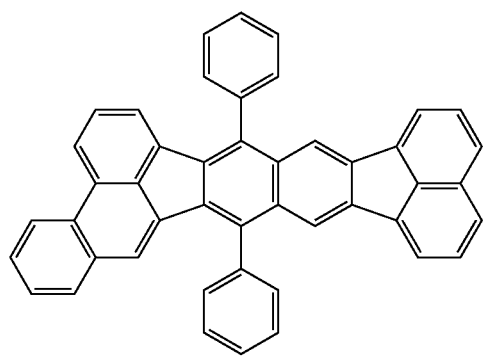
BD8
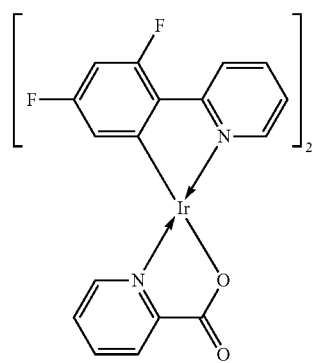
GD1
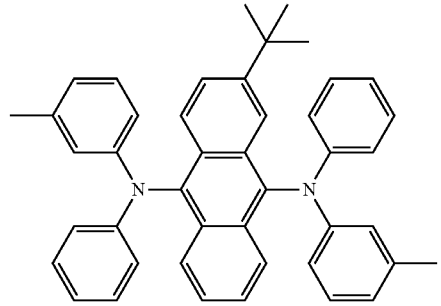
GD2
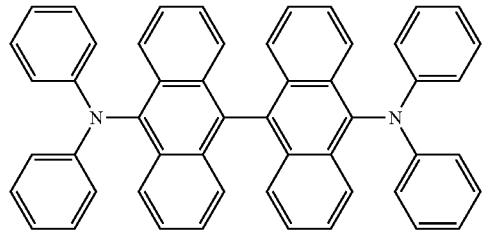
GD3
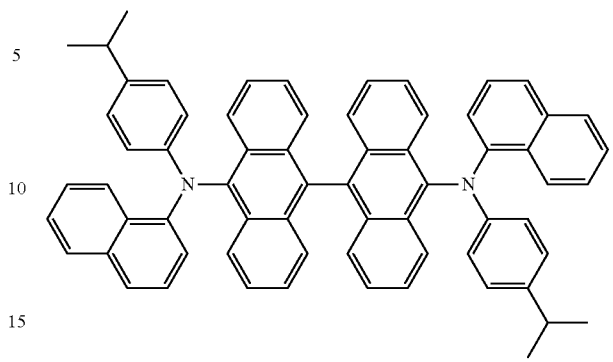
GD4
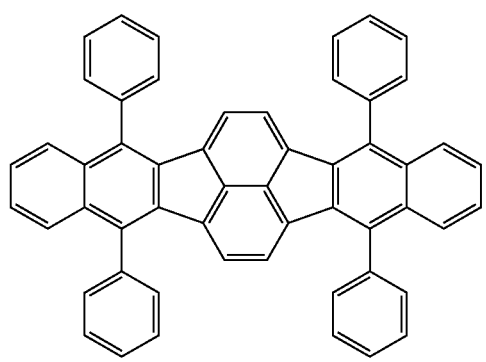
GD5
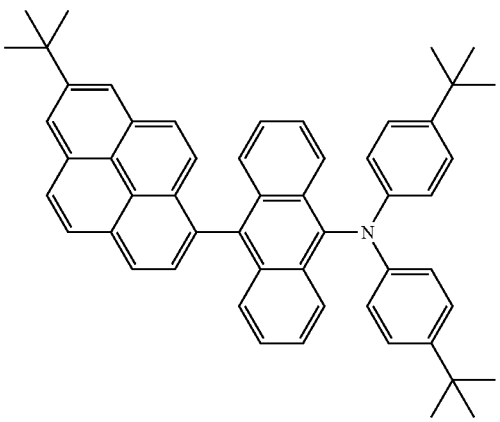
GD6
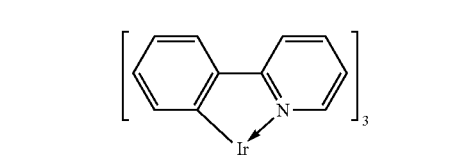
GD7
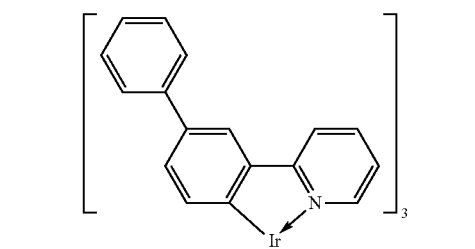

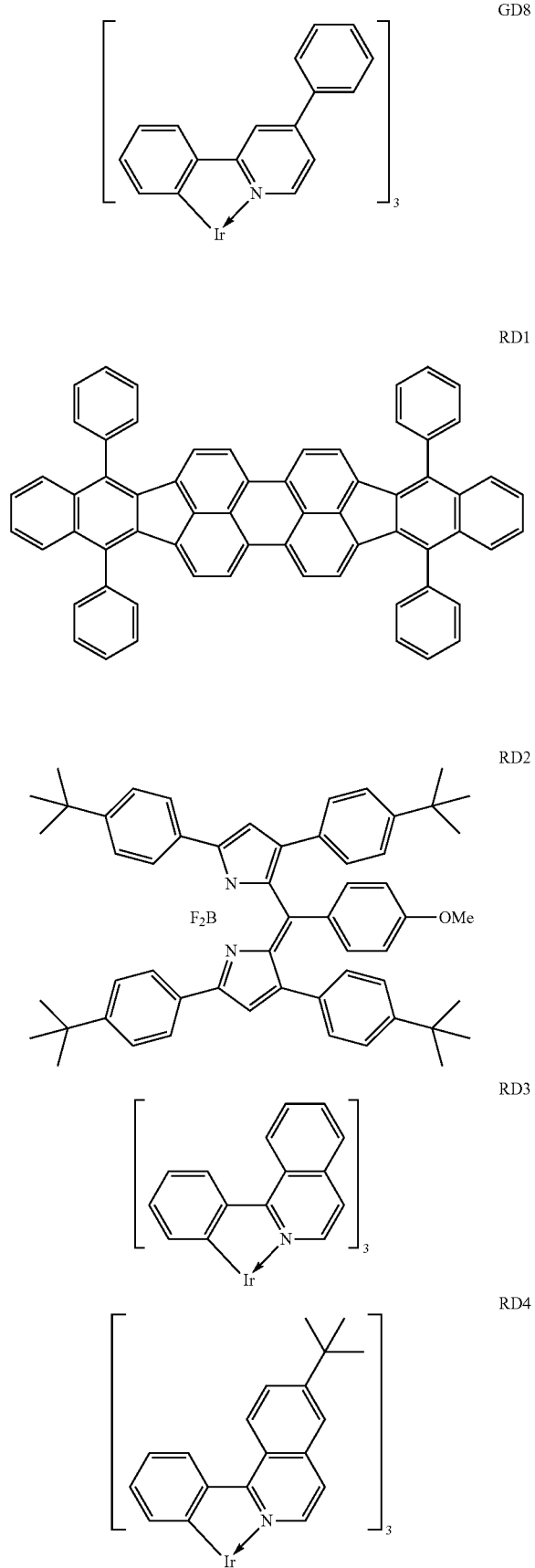

As the light emitting layer hosts or emitting assist materials contained in a light emitting layer, in addition to aromatic hydrocarbon compounds or derivatives thereof, carbazole derivatives, dibenzofuran derivatives, dibenzothiophene derivatives, organic aluminum complexes such as tris(8-quinolinolate)aluminum, organic beryllium complexes and the like are mentioned.

Specific examples of compounds used as the light emitting layer hosts or emitting assist materials contained in a light emitting layer will be now mentioned, but certainly not limited thereto.

EM1
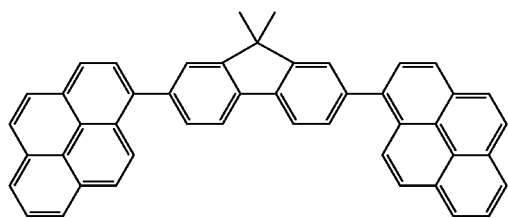
EM2
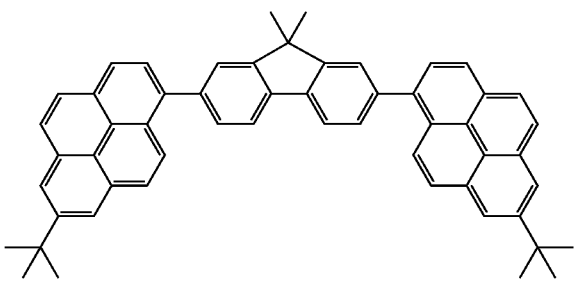
EM3
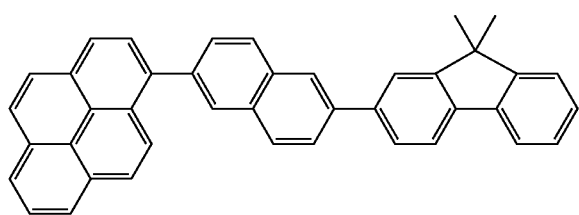
EM4
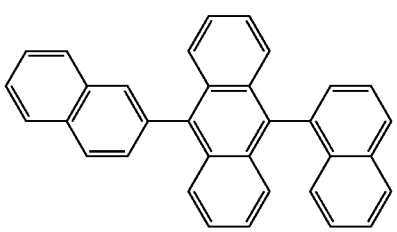
EM5
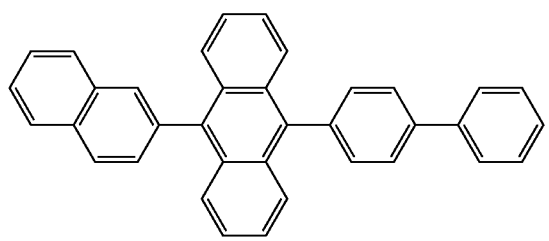
EM6
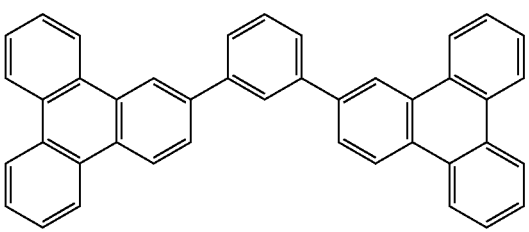
EM7
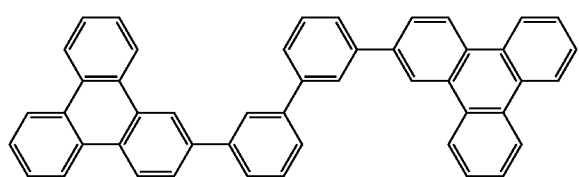
EM8
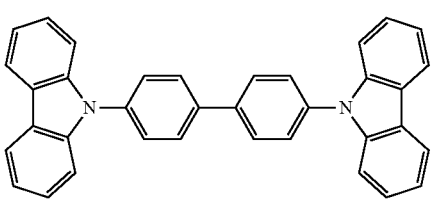
EM9
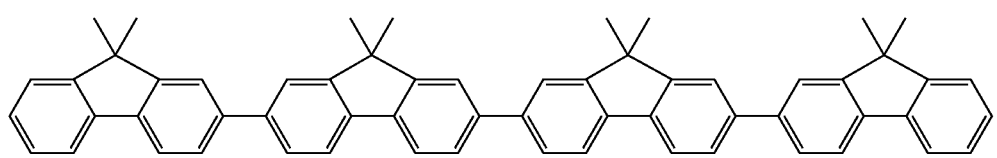
EM10
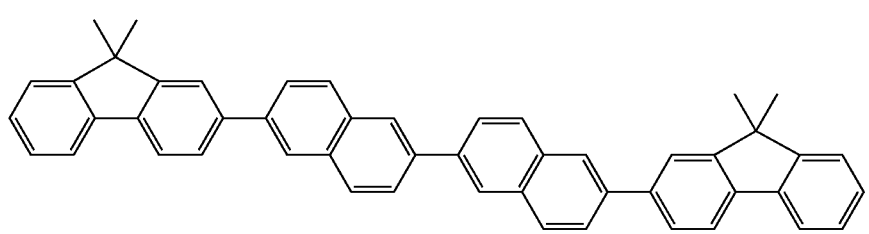

-continued

EM11
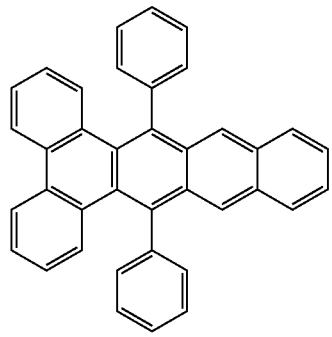

EM12
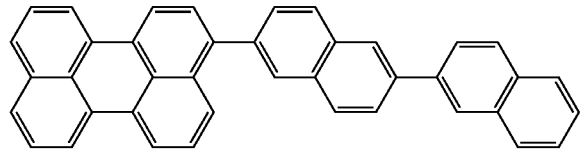

EM13
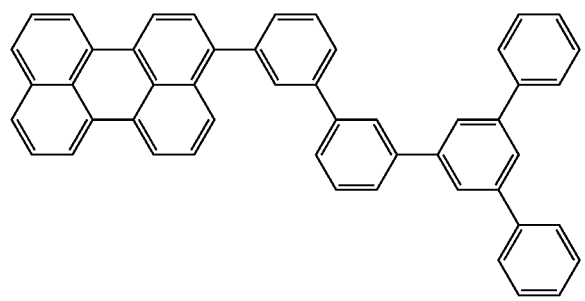

EM14
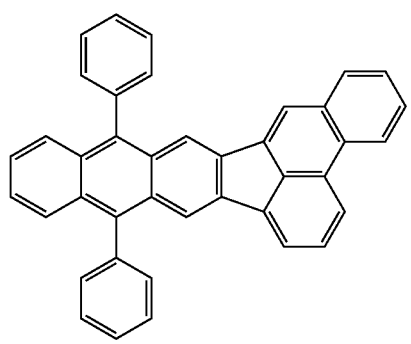

EM15
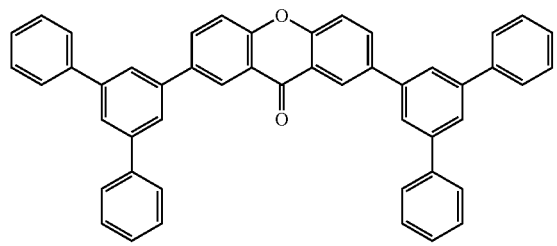

EM16
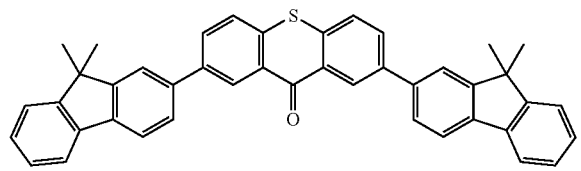

EM17
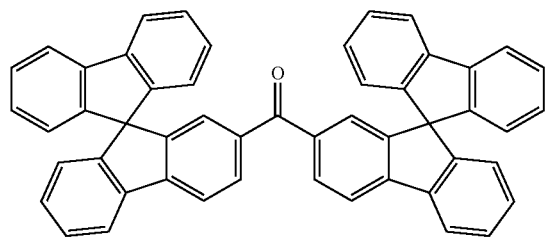

The electron transport material can be optionally selected from those which can transport electrons injected from a cathode to a light emitting layer, and is selected in view of the balance with the hole mobility of hole transport material and the like. Specifically, oxadiazole derivatives, oxazole derivatives, pyrazine derivatives, triazole derivatives, triazine derivatives, quinoline derivatives, quinoxaline derivatives, phenanthroline derivatives, organic aluminum complexes, fused ring compounds (e.g. fluorene derivatives, naphthalene derivatives, chrysene derivatives, anthracene derivatives etc.) are mentioned. Further, the above-mentioned electron transport materials are also suitably used for a hole blocking layer.

Specific examples of compounds used as electron transport materials will be now mentioned, but certainly not limited thereto.

ET1
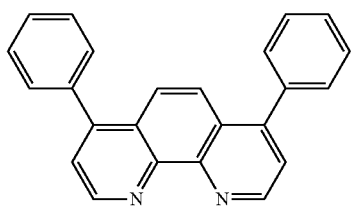

ET2
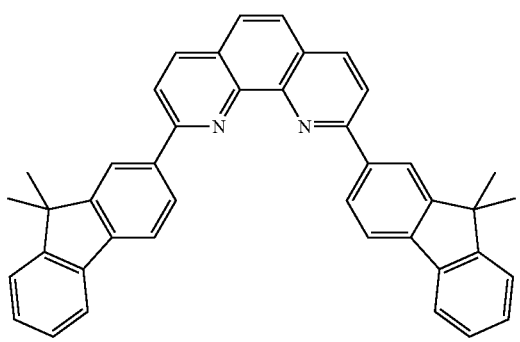

ET3
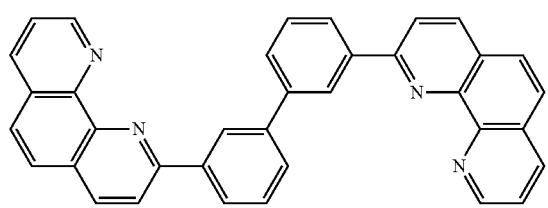

ET4
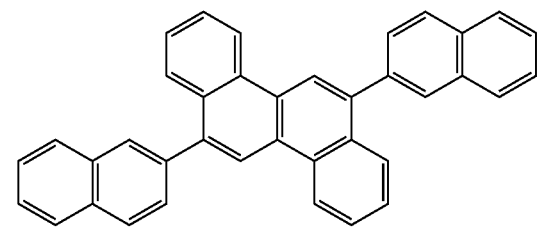

ET5
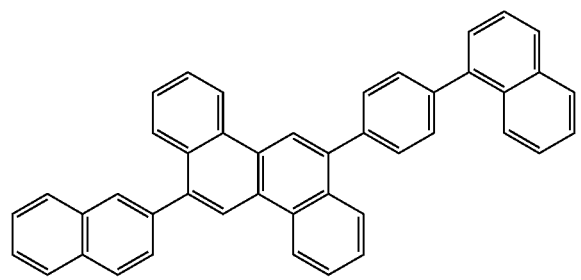

ET6
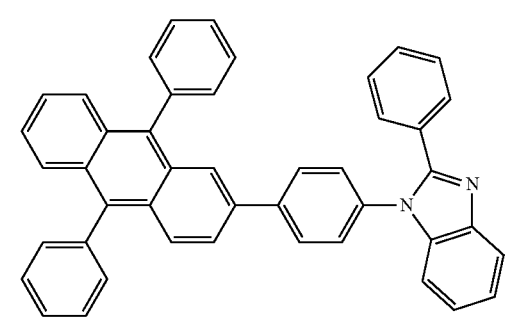

ET7
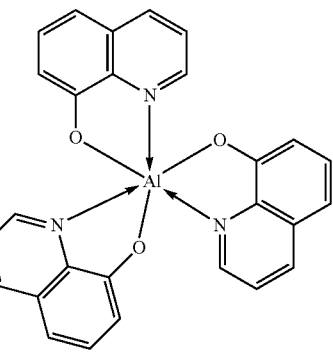

ET8
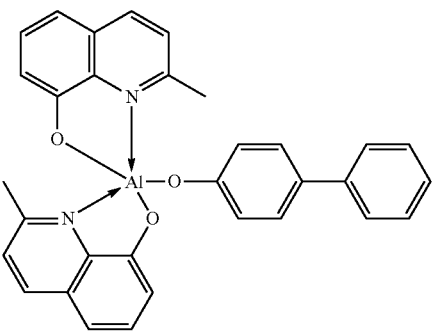

ET9
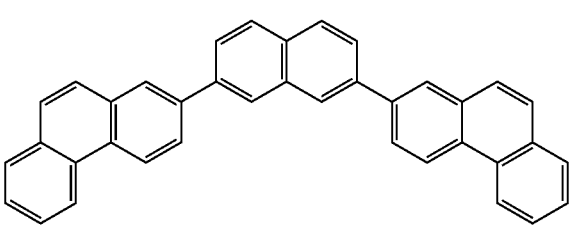

ET10
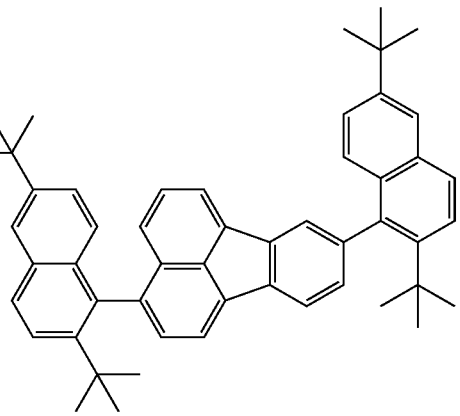

An electron injection material can be optionally selected from those which can easily inject electrons from a cathode, and is selected in view of the balance with hole injection properties and the like. The organic compound according to the present embodiment can be also used by mixing with an electron transport material. That is, in addition to the organic compound according to the present embodiment, a second compound can be contained. As the second compound, anthraquinone derivatives, fluorene derivatives, naphthalene derivatives, indene derivatives, terphenyl derivatives, acenaphthofluoranthene derivatives, indenoperylene derivatives and phenanthroline derivatives are mentioned, and phenanthroline derivatives, fluorene derivatives and naphthyl derivatives are preferred. The derivatives each may contain a substituent and preferably contains an electron-donating substituent such as a cyano group.

More specifically, the compounds represented by the following structural formulae are mentioned.

EI1
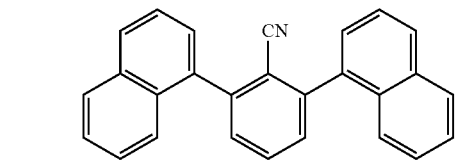

EI2
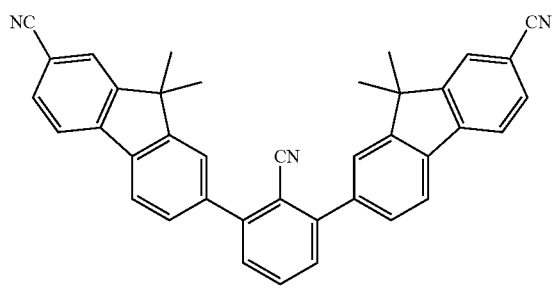

EI3
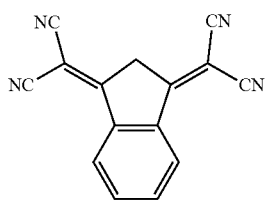

EI4
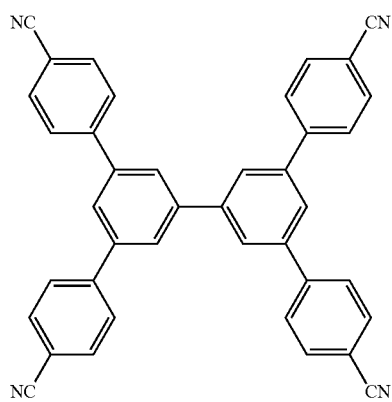

EI5
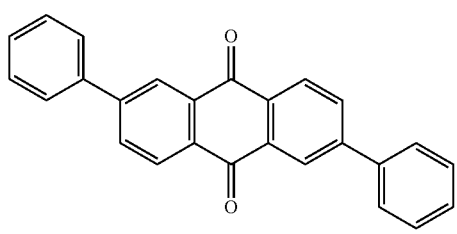

-continued

EI6
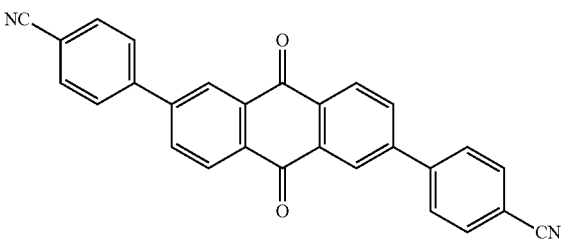

EI7
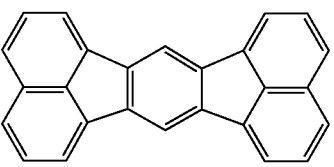

EI8
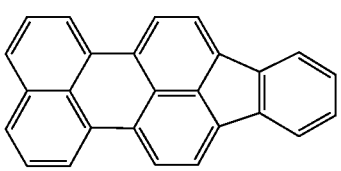

The constituent materials of the anode are preferably those which have a work function as high as possible. For example, simple metals such as aurum, platinum, silver, copper, nickel, palladium, cobalt, selenium, vanadium and tungsten, or alloys which these are combined, metal oxides such as tin oxide, zinc oxide, indium oxide, indium tin oxide (ITO) and indium zinc oxide can be used. In addition, conductive polymers such as polyaniline, polypyrrole and polythiophene can be also used.

These electrode substances may be used alone or two or more of the electrode substances may be used in combination. In addition, the anode may be constituted of a layer or may be constituted of a plurality of layers.

On the other hand, the constituent materials of the cathode are preferably those which have a low work function. Examples thereof include alkali metals such as lithium, alkaline earth metals such as calcium, and simple metals such as aluminum, titanium, manganese, silver, lead and chromium. Alternatively, alloys which these simple metals are combined can be also used. For example, magnesium-silver, aluminum-lithium, aluminum-magnesium and the like can be used. Metal oxides such as indium tin oxide (ITO) can be utilized. These electrode substances may be used alone or two or more of the electrode substances may be used in combination. In addition, the cathode may be constituted of a layer or may be constituted of multi layers.

Organic compound layers (a hole injection layer, a hole transport layer, an electron blocking layer, a light emitting layer, a hole blocking layer, an electron transport layer, an electron injection layer etc.) constituting the organic light emitting element of the present invention are formed by the methods given below.

For the organic compound layers constituting the organic light emitting element of the present invention, dry processes such as a vacuum evaporation method, an ionized evaporation method, sputtering and plasma can be used. In addition, wet processes, that is, after dissolution in a proper solvent, a layer is formed by a known coating method (e.g. spin coating, dipping, a casting method, a LB method, an ink-jet method etc.), can be also used in place of dry processes.

When a layer is formed by a vacuum evaporation method or a solution coating method or the like, crystallization and the like are difficult to occur and temporal stability is excellent. In addition, when a film is formed by a coating method, a film can be also formed by combining a proper binder resin.

As the above-mentioned binder resins, polyvinyl carbazole resin, polycarbonate resin, polyester resin, ABS resin, acrylic resin, polyimide resin, phenol resin, epoxy resin, silicon resin, urea resin and the like are mentioned, but not limited thereto.

In addition, these binder resins may be used alone as a homopolymer or a copolymer or two or more of the binder resins may be used in combination. Further, known additives such as a plasticizer, an antioxidant and a UV absorber may be combined as needed.

Uses of the Organic Light Emitting Element According to the Present Embodiment

The organic light emitting element of the present invention can be used as a constituent member for a display device and a lighting device. Further, there are uses such as an exposure light source of an electrophotographic image forming device, the backlight of a liquid crystal display device, a color filterless white light source and a light emitting device having a color filter and a white light source and the like.

The color filter is a filter into which at least any of, for example, three colors, red, green and blue, penetrates. A light emitting device combining a filter to adjust the chromaticity of a white color and a white light source can be used.

The display device contains the organic light emitting element of the present embodiment in its display unit. This display unit contains a plurality of luminous points. These luminous points contain the organic light emitting element of the present invention and an active element connected to the organic light emitting element. Herein, as the luminous points, a pixel and the like are mentioned.

As an example of active elements, a switching element to control emitted luminance or an amplifying element is mentioned, and more specifically, a transistor is mentioned.

In this organic light emitting element, the anode or the cathode and the drain electrode or source electrode of a transistor are electrically connected. Herein, the display device can be used as an image display device of PC and the like.

The display device contains an input unit to input image information from area CCD, linear CCD, memory cards and the like, and may be an image display device to display the input image on a display unit.

In addition, in display units which an imaging device and an ink-jet printer contain, both an image output function to display image information input from the outside and an input function to input processing information to an image as an operation panel may be contained. The display device may be also used as a display unit of a multifunction printer.

When the organic light emitting element according to the present embodiment is used for a display unit, a touch panel function can be contained. Touch panel function systems may be a capacitive method, a resistive method or an infrared method.

A lighting device is, for example, a device to illuminate rooms. The lighting device may be a device which emits any of a white color, a neutral white color and further colors from blue to red.

In the present embodiment, the white color has, for example, a color temperature of 4200 K and the neutral white color has, for example, a color temperature of 5000 K. A lighting device may further contain a color filter.

The lighting device according to the present embodiment contains the organic light emitting element according to the present embodiment and an AC/DC converter circuit connected thereto and used to supply driving voltage.

The AC/DC converter circuit according to the present embodiment is a circuit to convert from AC voltage to DC voltage.

In addition, the lighting device according to the present embodiment may contain a heat release unit to release heat from a light emitting unit and a circuit to the outside of the device. As the heat release unit, a radiator plate constituted of a metal with high thermal conductivity and liquid silicon and the like are mentioned. As metals with high thermal conductivity, for example, metals having aluminum are mentioned. When liquid silicon is used in the heat release unit, heat can be released by convection of liquid silicon.

The image forming device according to the present embodiment is an image forming device containing a photo conductor, an electrification unit to electrify the surface of this photo conductor, an exposure unit to expose the photo conductor, and a developing unit to develop an electrostatic latent image formed on the surface of the photo conductor, and a means of exposure contains the organic light emitting element of the present embodiment.

As the exposure unit, for example, an exposure apparatus containing the organic light emitting element according to the present embodiment is mentioned. The organic light emitting elements which the exposure apparatus contains may be arranged in lines or may be a form in which the whole exposure surface of the exposure apparatus emits light.

In addition, as uses other than an organic light emitting element, the organic compound of the present invention can be used for organic solar batteries, organic TFT, fluorescence sensing materials for a living body and the like, films, filters and the like.

The display device using the organic light emitting element of the present embodiment will be now described using FIG. 1.

In the display device 1 in FIG. 1, the glass substrate 11 and the moisture proof film 12 to protect the TFT element or organic compound layers on the upper part thereof are provided. In addition, the sign 13 is the metallic gate electrode 13. The sign 14 is the gate insulating film 14 and 15 is the semiconductor layer.

The TFT element 18 contains the semiconductor layer 15, the drain electrode 16 and the source electrode 17. The insulating film 19 is provided on the upper part of the TFT element 18. The anode 21 and the source electrode 17 constituting the organic light emitting element are connected via the contact holes 20.

It is noted that the system of electrical connection between the electrodes (anode and cathode) contained in the organic light emitting element, and the electrodes (source electrode and drain electrode) contained in TFT is not limited to the mode shown in FIG. 1. That is, either the anode or the cathode and either the source electrode or the drain electrode of the TFT element only need to be electrically connected.

In the display device 1 in FIG. 1, the organic compound layers are shown like a layer, but the organic compound layer 22 may be the multilayer form. A first protection layer 24 and a second protection layer 25 to inhibit the deterioration of the organic light emitting element are provided on the top side of the cathode 23.

In the display device 1 in FIG. 1, a transistor is used as a switching element, but in place of this, a MIM element may be used as a switching element.

The transistor used in the display device 1 in FIG. 1 is not limited to a transistor using a single crystal silicon wafer and may be a thin film transistor having an active layer on the insulating surface of a substrate. As the active layer, single crystal silicon, amorphous silicon, non-single crystal silicon such as microcrystalline silicon, non-single crystal oxide semiconductors such as indium zinc oxide and indium gallium zinc oxide, a transparent oxide semiconductor are mentioned. It is noted that a thin film transistor is also referred to as a TFT element.

The transistor contained in the display device 1 in FIG. 1 may be formed within a substrate such as a Si substrate. The formation within a substrate means that a transistor is produced by processing a substrate such as a Si substrate itself. That is, having a transistor within a substrate can be also considered that the substrate and the transistor are formed together.

Whether or not a transistor is provided within a substrate is selected depending on resolution. In the case of a 1 inch QVGA resolution, for example, it is preferred that a transistor be provided within a Si substrate. The organic light emitting device according to the present invention may contain a switching element to control the light emission of the organic light emitting element. The switching element connected to the organic light emitting element may contain an oxide semiconductor in the channel unit thereof. The oxide semiconductor may be amorphous or a crystal or a state in which both exists.

The crystal may be a single crystal, a microcrystal, or a crystal in which a specific axis such as the C axis is oriented, or a mixture of at least two of them.

The organic light emitting device containing such switching element may be used as an image display device in which each organic light emitting element is provided as a pixel, or may be used as a lighting device, and also may be used as an exposure light source to expose a photo conductor of an electrophotographic image forming device such as a laser beam printer or a copying machine.

Figure 2:
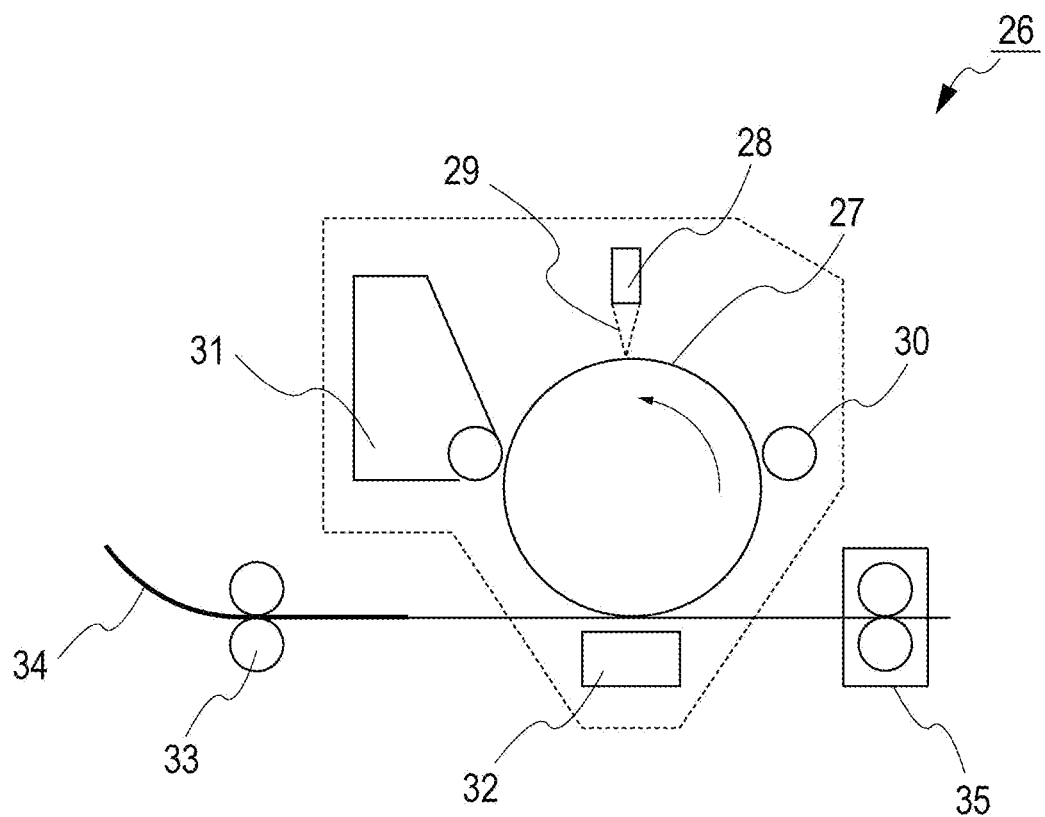
FIG. 2 is a schematic diagram of an image forming device containing the organic light emitting element according to the present invention.

FIG. 2 is a schematic diagram of an image forming device 26 according to the present invention. The image forming device contains a photo conductor, an exposure light source, a developing machine, an electrification unit, a transcriber, a supply roller and a fuser.

The light 29 is emitted from the exposure light source 28 and an electrostatic latent image is formed on the surface of photo conductor 27. This exposure light source contains the organic light emitting element according to the present invention. The developing machine 30 contains a toner and the like. The electrification unit 31 electrifies the photo conductor. The transcriber 32 copies the developed image into a recording medium. The supply roller 33 supplies the recording medium. The recording medium 34 is for example paper. The fuser 35 fixes the formed image on the recording medium.

Figure 3:
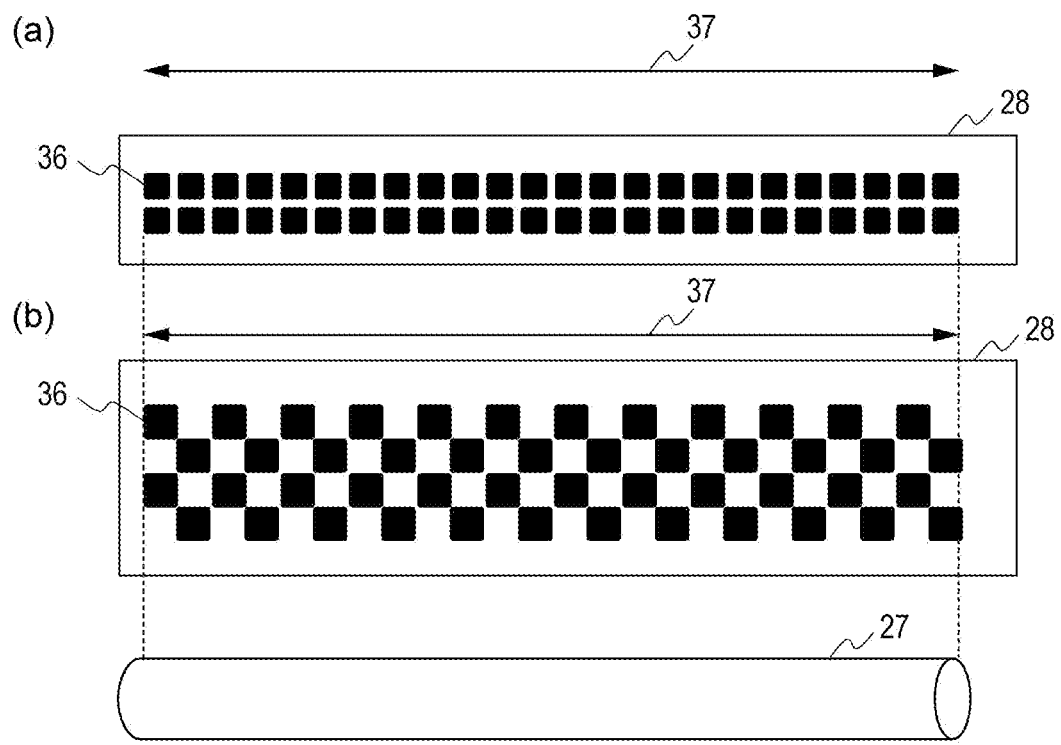
FIG. 3 is a schematic diagram of an exposure apparatus containing the organic light emitting element involved in the present invention.

FIG. 3(a) and FIG. 3(b) are schematic diagrams showing the state in which a plurality of light emitting units 36 is arranged on the exposure light source 28 on a long substrate.

The arrow 37 shows the line direction in which organic light emitting elements are arranged. This line direction is the same as the direction of an axis on which the photo conductor 27 rotates.

FIG. 3(a) is the form in which light emitting units are arranged along the axis direction of the photo conductor. FIG. 3(b) is the form in which light emitting units are alternately arranged in the line direction in each of the first line and the second line. In the first line and the second line, the units are arranged in different places in the row direction.

In the first line, a plurality of light emitting units is arranged at intervals. The second line contains light emitting units in the places corresponding to the intervals of light emitting units in the first line. That is, a plurality of light emitting units is arranged at intervals in the row direction.

In other words, the arrangement in FIG. 3(b) can be referred to as, for example, the state of lattice arrangement, the state of zigzag lattice arrangement, or a checked pattern.

Figure 4:
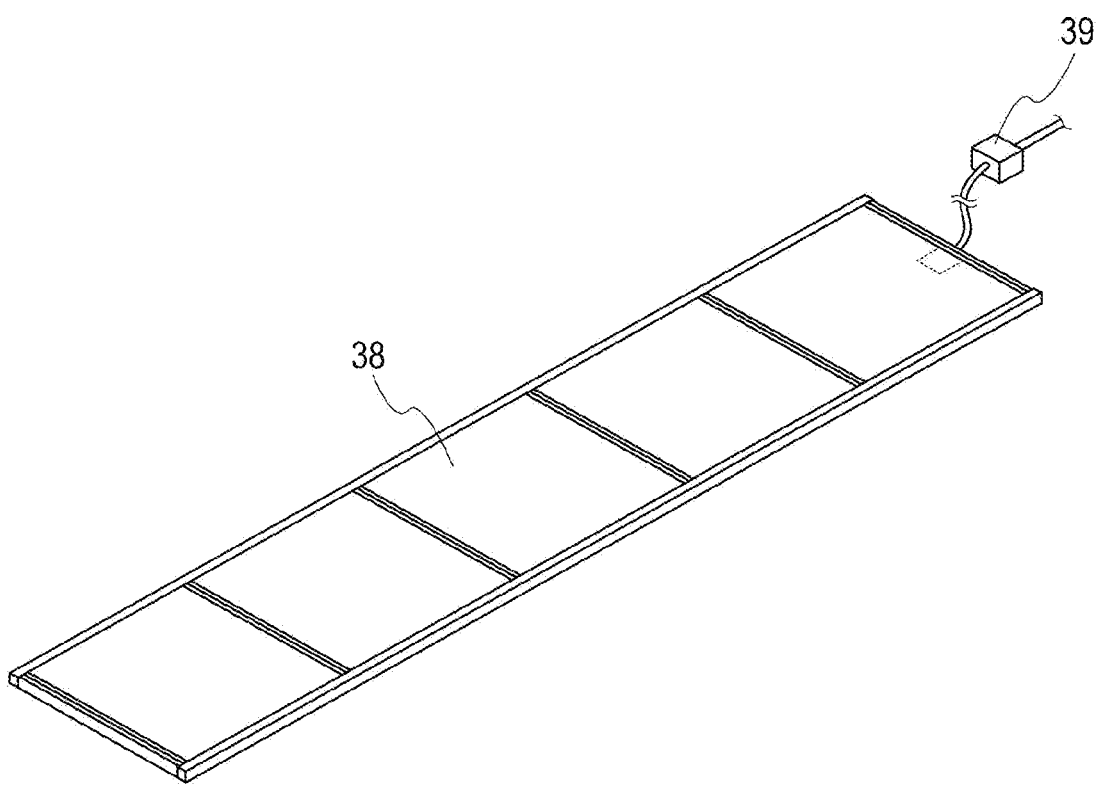
FIG. 4 is a schematic diagram of a lighting device containing the organic light emitting element according to the present invention.

FIG. 4 is a schematic diagram of the lighting device according to the present invention. The lighting device contains a substrate, the organic light emitting elements 38 and the AC/DC converter circuit 39. In addition, for example, a radiator plate, which is not shown, can be contained in the back side of a substrate surface on the side on which the organic light emitting elements are put.

As described above, by driving a display device using the organic light emitting element of the present invention, a display which has an excellent image quality and is stable for a long period of time can be obtained at low driving voltage.

Exemplary Embodiments

[Exemplary Embodiments 1 to 2, Comparative Examples 1 to 4]

In the present exemplary embodiment, organic light emitting elements in which an anode, a hole transport layer, an electron blocking layer, a light emitting layer, a hole blocking layer, an electron transport layer, an electron injection layer and a metal electrode layer (cathode) were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer shown in Table 2 given below were formed on the above-mentioned ITO substrate. It is noted that at this time, the electrodes facing each other (metal electrode layer, cathode) were formed so that the electrode area would be 3 $mm^2$.

TABLE 2

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST) G-4 (GUEST) (G-3:G-4 = 98:2 (WEIGHT RATIO)) | 30 |
| HOLE BLOCKING LAYER | G-5 | 10 |
| ELECTRON TRANSPORT LAYER | G-6 | 15 |

TABLE 2-continued

| | MATERIAL | FILM THICKNESS (nm) |
|---|---|---|
| ELECTRON INJECTION LAYER, | G-7<br>G-8<br>(G-7:G-8 = 50:50 (WEIGHT RATIO)) | 15 |
| METAL ELECTRODE LAYER | Al | 100 |

Before the metal electrode layer was formed, an element was immersed in water for 10 minutes, followed by vacuum drying at 120° C., and the metal electrode layer was then formed.

As G1 to G7, the compounds shown in Table 3 given below were used. For G8, the bisimidazolidene compounds used in the present invention and comparative compounds (1) to (4) were used and the evaluation was made. It is noted that the compound names such as HT1 correspond to those described in the present embodiment. In addition, the names such as A1 described as G8 correspond to those of exemplified compounds.

TABLE 3

| | G1 | G2 | G3 | G4 | G5 | G6 | G7 | G8 | LIGHT EMITTING STATE |
|---|---|---|---|---|---|---|---|---|---|
| EXEMPLARY EMBODIMENT 1 | HT1 | HT7 | EM1 | BD7 | ET2 | ET2 | ET2 | A1 | ○ |
| EXEMPLARY EMBODIMENT 2 | HT1 | HT7 | EM1 | BD7 | ET2 | ET2 | ET2 | B4 | ○ |
| COMPARATIVE EXAMPLE 1 | HT1 | HT7 | EM1 | BD7 | ET2 | ET2 | ET2 | COMPARATIVE COMPOUND 1 | X |
| COMPARATIVE EXAMPLE 2 | HT1 | HT7 | EM1 | BD7 | ET2 | ET2 | ET2 | COMPARATIVE COMPOUND 2 | X |
| COMPARATIVE EXAMPLE 3 | HT1 | HT7 | EM1 | BD7 | ET2 | ET2 | ET2 | COMPARATIVE COMPOUND 3 | X |
| COMPARATIVE EXAMPLE 4 | HT1 | HT7 | EM1 | BD7 | ET2 | ET2 | ET2 | COMPARATIVE COMPOUND 4 | X |

Consequently, when light emission was observed by applying a voltage of 8 V, light emission could be observed about the compounds of the present invention, but light emission could not be observed about the comparative compounds (1) to (4).

It is believed that this is caused by losing electron injection properties due to the outflow or deterioration of the comparative compounds during immersion into water. That is, stable organic light emitting elements could not be obtained.

[Exemplary Embodiments 3 to 10]

Organic light emitting elements in which an anode, a hole transport layer, an electron blocking layer, a light emitting layer, a hole blocking layer, an electron transport layer, an electron injection layer and a metal electrode layer (cathode) were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer were formed on the above-mentioned ITO substrate shown in Table 4 given below. It is noted that at this time, the electrodes facing each other (metal electrode layer, cathode) were formed so that the electrode area thereof would be 3 mm².

TABLE 4

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST)<br>G-4 (GUEST)<br>(G-3:G-4 = 98:2 (WEIGHT RATIO)) | 30 |

TABLE 4-continued

| | MATERIAL | FILM THICKNESS (nm) |
|---|---|---|
| HOLE BLOCKING LAYER | G-5 | 10 |
| ELECTRON TRANSPORT LAYER | G-6 | 15 |
| ELECTRON INJECTION LAYER, | G-7<br>G-8<br>(G-7:G-8 = 50:50 (WEIGHT RATIO)) | 15 |
| METAL ELECTRODE LAYER | Al | 100 |

As G1 to G7, the compounds shown in Table 5 given below were used. For G8, the bisimidazolidene compounds according to the present invention were used and the evaluation was made.

TABLE 5

| | G1 | G2 | G3 | G4 | G5 | G6 | G7 | G8 | LIGHT EMISSION EFFICIENCY (cd/A) | VOLTAGE (V) |
|---|---|---|---|---|---|---|---|---|---|---|
| EXEMPLARY EMBODIMENT 3 | HT2 | HT7 | EM1 | BD1 | ET2 | ET2 | ET3 | A1 | 3 | 7 |
| EXEMPLARY EMBODIMENT 4 | HT2 | HT9 | EM3 | BD6 | ET5 | ET2 | ET1 | A1 | 3 | 7 |
| COMPARATIVE EXAMPLE 5 | HT4 | HT4 | EM7 | GD7 | ET4 | ET3 | ET3 | A2 | 15 | 7 |
| COMPARATIVE EXAMPLE 6 | HT6 | HT8 | EM9 | RD4 | ET10 | ET3 | ET2 | A18 | 7 | 6 |
| COMPARATIVE EXAMPLE 7 | HT6 | HT8 | EM12 | RD1 | ET9 | ET2 | ET4 | A19 | 4 | 6 |
| COMPARATIVE EXAMPLE 8 | HT2 | HT9 | EM13 | RD2 | ET4 | ET3 | ET3 | B2 | 4 | 6 |
| COMPARATIVE EXAMPLE 9 | HT1 | HT9 | EM5 | GD4 | ET2 | ET3 | ET2 | B6 | 6 | 6 |
| COMPARATIVE EXAMPLE 10 | HT1 | HT7 | EM4 | BD7 | ET10 | ET3 | ET2 | A5 | 3 | 6 |

[Exemplary Embodiments 11 to 12]

Organic light emitting elements in which an anode, a hole transport layer, an electron blocking layer, a light emitting layer, a hole blocking layer, an electron transport layer, an electron injection layer and a metal electrode layer (cathode) were sequentially formed on a substrate were produced.

First, an ITO film was formed on a glass substrate, and an ITO electrode (anode) was formed by carrying out desired patterning processing. At this time, the film thickness of the ITO electrode was 100 nm. As described above, the substrate in which the ITO electrode was formed was used as an ITO substrate in the following step.

The organic compound layers and electrode layer shown in Table 6 given below were formed on the above-mentioned ITO substrate. It is noted that at this time, the electrodes facing each other (metal electrode layer, cathode) were formed so that the electrode area thereof would be 3 mm².

TABLE 6

| | MATERIAL | FILM THICKNESS (nm) |
|---|---|---|
| HOLE TRANSPORT LAYER | G-1 | 30 |
| ELECTRON BLOCKING LAYER | G-2 | 10 |
| LIGHT EMITTING LAYER | G-3 (HOST) G-4 (GUEST) (G-3:G-4 = 98:2 (WEIGHT RATIO)) | 30 |
| HOLE BLOCKING LAYER | G-5 | 10 |
| ELECTRON TRANSPORT LAYER | G-6 | 25 |
| ELECTRON INJECTION LAYER, | G-8 | 5 |
| METAL ELECTRODE LAYER | Al | 100 |

As G1 to G7, the compounds shown in Table 7 given below were used. For G8, 1,1',3,3a,3',3'a,4,4',5,5',6,6',7,7a,7',7'a-hexadecahydro-2,2'-bibenzo[d]imidazolidene compounds according to the present embodiment were used and the evaluation was made.

TABLE 7

| | G1 | G2 | G3 | G4 | G5 | G6 | G8 | LIGHT EMISSION EFFICIENCY (cd/A) | VOLTAGE (V) |
|---|---|---|---|---|---|---|---|---|---|
| EXEMPLARY EMBODIMENT 11 | HT2 | HT7 | EM1 | BD1 | ET2 | ET2 | A5 | 4 | 9 |
| EXEMPLARY EMBODIMENT 12 | HT2 | HT9 | EM3 | BD1 | ET5 | ET4 | A8 | 3 | 9 |

As described above using exemplary embodiments, by using an organic compound containing the bisimidazolidene skeleton according to the present embodiment for an electron injection layer of a light emitting element, an element with stability to water can be produced. Thus, a stable and long-life element can be obtained.

As described above, by using a compound containing the bisimidazolidene skeleton for an electron injection layer, the organic light emitting element according to the present invention is stable to water and humidity. Thus, an organic light emitting element which has high light emission efficiency and excellent long-life characteristics can be provided.

According to the present invention, an organic light emitting element with high stability can be provided by containing a bisimidazolidene compound with low reactivity to moisture in an electron injection layer of an organic light emitting element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-253636, filed Dec. 6, 2013, which is hereby incorporated by reference herein in its entirety.

What is claimed is:

1. An organic light emitting element containing an anode and a cathode, and a light emitting layer arranged between the anode and the cathode, and
the organic light emitting element further containing an organic compound layer which is arranged between the cathode and the light emitting layer and touches the cathode,
wherein the organic compound layer contains a bisimidazolidene compound represented by the following general formula [1]:

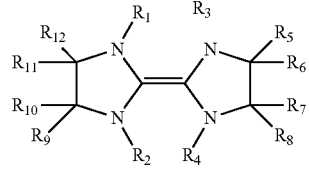

[1]

in the formula [1], $R_1$ to $R_4$ are each independently selected from the group consisting of a substituted or unsubstituted phenyl group, a substituted or unsubstituted benzyl group, a substituted or unsubstituted biphenyl group, a substituted or unsubstituted naphthyl group, a substituted or unsubstituted phenanthrenyl group, a substituted or unsubstituted fluorenyl group, a substituted or unsubstituted triphenylenyl group, a substituted or unsubstituted dibenzofuranyl group, and a substituted or unsubstituted dibenzothiophenyl group; and
$R_5$ to $R_{12}$ are each independently selected from the group consisting of a hydrogen atom, an alkyl group having 1 or more and 4 or less carbon atoms and a substituted or unsubstituted phenyl group.

2. The organic light emitting element according to claim 1,
wherein, in the general formula [1], the $R_5$ to $R_{12}$ are selected from the group consisting of a hydrogen atom and an alkyl group having 1 or more and 4 or less carbon atoms.

3. The organic light emitting element according to claim 1,
wherein, when the phenyl group, the benzyl group, the biphenyl group, the naphthyl group, the phenanthrenyl group, the fluorenyl group, the triphenylenyl group, the dibenzofuranyl group and the dibenzothiophenyl group represented by the $R_1$ to $R_4$ contain substituents, the substituents are each independently selected from the group consisting of an alkyl group having 1 or more and 4 or less carbon atoms, an alkoxy group having 1 or more and 4 or less carbon atoms, a cyano group and an amino group having an alkyl group or a phenyl group.

4. The organic light emitting element according to claim 1, wherein the organic compound layer contains a second compound which is of a different type from the bisimidazolidene compound.

5. The organic light emitting element according to claim 4, wherein, when the sum total of the organic compound represented by the general formula [1] and the second compound is 100 wt %, the weight ratio of the second compound is 0.1 wt % to 80 wt %.

6. The organic light emitting element according to claim 1,
wherein the light emitting layer contains a plurality of types of light emitting materials,
wherein at least one of the plurality of types of light emitting materials is a light emitting material emitting color light different from that of other light emitting materials,
wherein the light emitting layer is a light emitting layer emitting white light by mixing light emitted from the plurality of types of light emitting materials.

7. The organic light emitting element according to claim 1,
further containing a second light emitting layer emitting color light different from that of the light emitting layer,
wherein the element emits white light by mixing light emitted from the light emitting layer and light emitted from the second light emitting layer.

8. A display device containing a plurality of luminous points,
wherein the luminous points contain the organic light emitting element according to claim 1 and an active element connected to the organic light emitting element.

9. The display device according to claim 8, wherein the active element is a transistor,
wherein the transistor contains an oxide semiconductor in a channel unit thereof.

10. An image display device containing a display unit to display images, and
an input unit to input image information,
wherein the display unit is the display device according to claim 8.

11. A lighting device containing the organic light emitting element according to claim 1, and
an AC/DC converter circuit connected to the organic light emitting element.

12. A lighting device containing the organic light emitting element according to claim 1, and a heat release unit to release heat in the device to the outside of the device.

13. A lighting device containing the organic light emitting element according to claim 1, and a switching element connected to the organic light emitting element,
   wherein the switching element is a transistor,
   wherein the transistor contains an oxide semiconductor in a channel unit thereof.

14. An electrophotographic image forming device containing:
   a photo conductor;
   an electrification unit which electrifies a surface of the photo conductor;
   an exposure unit which exposes the photo conductor to form an electrostatic latent image; and
   a developing unit which develops the electrostatic latent image, and
   wherein the exposure unit contains the organic light emitting element according to claim 1.

15. The image forming device according to claim 14, wherein the exposure unit further contains a switching element connected to the organic light emitting element,
   wherein the switching element contains an oxide semiconductor in a channel unit.

16. An exposure device which exposes a photo conductor,
   wherein the exposure device contains the organic light emitting elements according to claim 1,
   wherein the organic light emitting elements are arranged in lines.

* * * * *